United States Patent
Joshi et al.

(10) Patent No.: US 6,825,556 B2
(45) Date of Patent: Nov. 30, 2004

(54) INTEGRATED CIRCUIT PACKAGE DESIGN WITH NON-ORTHOGONAL DIE CUT OUT

(75) Inventors: Mukul A. Joshi, Santa Clara, CA (US); Mohan R. Nagar, Milpitas, CA (US); Sarathy Rajagopalan, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/271,003

(22) Filed: Oct. 15, 2002

(65) Prior Publication Data

US 2004/0070058 A1 Apr. 15, 2004

(51) Int. Cl.[7] .......................... H05K 3/34; H01L 27/15; H01L 31/12
(52) U.S. Cl. .................. 257/707; 257/706; 257/712; 257/713; 257/717; 257/720; 257/778; 257/737; 257/738; 257/730; 257/773
(58) Field of Search ................................ 257/707, 706, 257/710, 712, 713, 717, 720, 730, 773, 738, 737, 778

(56) References Cited

U.S. PATENT DOCUMENTS

| | | | | |
|---|---|---|---|---|
| 5,566,448 A | * | 10/1996 | Bhatt et al. ................... | 29/847 |
| 5,990,418 A | * | 11/1999 | Bivona et al. ............. | 174/52.4 |
| 6,002,171 A | * | 12/1999 | Desai et al. ................. | 257/707 |
| 6,058,015 A | * | 5/2000 | Sammakia et al. ......... | 361/705 |
| 6,111,313 A | * | 8/2000 | Kutlu .......................... | 257/697 |
| 6,141,497 A | * | 10/2000 | Reinicke et al. ............ | 392/485 |
| 6,313,521 B1 | * | 11/2001 | Baba .......................... | 257/678 |
| 6,472,762 B1 | * | 10/2002 | Kutlu .......................... | 257/778 |
| 6,507,116 B1 | * | 1/2003 | Caletka et al. .............. | 257/778 |
| 6,552,368 B2 | * | 4/2003 | Tamai et al. ................... | 257/98 |
| 6,607,942 B1 | * | 8/2003 | Tsao et al. ................... | 438/122 |
| 2001/0040300 A1 | * | 11/2001 | Huang et al. ................ | 257/787 |
| 2002/0163006 A1 | * | 11/2002 | Yoganandan et al. ......... | 257/81 |
| 2003/0030140 A1 | * | 2/2003 | Shim .......................... | 257/778 |
| 2003/0141586 A1 | * | 7/2003 | Alcoe et al. ................. | 257/710 |

* cited by examiner

*Primary Examiner*—Alexander Oscar Williams
(74) *Attorney, Agent, or Firm*—Luedeka, Neely & Graham, P.C.

(57) ABSTRACT

A packaged integrated circuit including a package substrate having electrical contacts for receiving an integrated circuit. The integrated circuit is electrically connected to the electrical contacts of the package substrate. A stiffener is mounted to the package substrate, where the stiffener has a non-orthogonal cut out in which the integrated circuit is disposed. The edges of the cut out are disposed at no greater a distance from the corners of the integrated circuit than they are from the sides of the integrated circuit.

7 Claims, 2 Drawing Sheets

INTEGRATED CIRCUIT PACKAGE DESIGN WITH NON-ORTHOGONAL DIE CUT OUT

FIELD

This invention relates to the field of integrated circuit fabrication. More particularly, this invention relates to packaging of integrated circuits.

BACKGROUND

Integrated circuits are preferably packaged prior to use in a larger circuit, so as to protect the integrated circuit and provide for electrical interconnections with other parts of the larger circuit that are more easily made. Different types of packaging are used for different types of integrated circuits. For example, one type of integrated circuit is classified as a flip chip. Flip chips are distinguishable from other types of integrated circuits in that the electrical contacts for the integrated circuit, or bonding pads, are typically distributed across the entire top surface of the integrated circuit, rather than being limited to a few rows around the peripheral edge of the integrated circuit, as is done with some other integrated circuit types.

Flip chip integrated circuits are typically packaged by attaching them with solder bumps to a package substrate. Electrical connections to an outside circuit are made through the package substrate, which reduces the concern that the integrated circuit may be damaged, such as by further handling. The mounted flip chip is under filled with a material to enhance the structural strength of the integrated circuit and package substrate combination.

Two other elements are typically added to a flip chip package. The first is a stiffener, which is used to increase the structural strength of the package substrate. The package substrate is often a relatively thin, flexible structure. If the package substrate is allowed to flex to an excessive degree after the integrated circuit is mounted, the mechanical stresses inherent in the flexation may be transferred to and damage the integrated circuit. Typically, the stiffener is a piece of relatively rigid material, such as a flat piece of metal, that has a square or rectangular hole cut in the middle of it. The stiffener is attached to the package substrate, with the integrated circuit disposed in the square cut out of the stiffener.

The second additional element is a heat spreader, which is used to more efficiently remove thermal energy from the integrated circuit. When the integrated circuit is in use, it tends to generate thermal energy as a by product of the electrical activity within the integrated circuit. If the thermal energy is not adequately dissipated, it tends to build up and be expressed by a temperature increase in the integrated circuit. If the thermal energy is not sufficiently dissipated, then the temperature increase may reach a level that is damaging to the integrated circuit. The heat spreader is typically a structure such as a lid, which is connected to both the package substrate and the integrated circuit. The connection between the integrated circuit and the heat spreader typically exhibits good heat conduction properties. In addition, the heat spreader typically conducts thermal energy well, and is formed of a material such as a metal.

Unfortunately, there are often problems associated with these two elements of the packaged integrated circuit. For example, in regard to the stiffener, it is desirable to have it come close to the corners of the integrated circuit, but reducing the size of the cut out tends to create problems with the under fill material that is exposed at the sides of the integrated circuit. In regard to the heat spreader, it is easily misaligned when attached to the package substrate, thus creating problems with the reliability of the packaged integrated circuit.

What is needed, therefore, is package design that overcomes these and other problems with integrated circuit package designs.

SUMMARY

The above and other needs are met by a packaged integrated circuit according to the present invention. The packaged integrated circuit includes a package substrate having electrical contacts for receiving an integrated circuit. The integrated circuit is electrically connected to the electrical contacts of the package substrate. A stiffener is mounted to the package substrate, where the stiffener has a non-orthogonal cut out in which the integrated circuit is disposed. The edges of the cut out are disposed at no greater a distance from the corners of the integrated circuit than they are from the sides of the integrated circuit.

Thus, in this manner the stiffener provides enhanced structural support to the packaged integrated circuit, because the edges of the cut out are disposed at no greater a distance from the corners of the integrated circuit than they are from the sides of the integrated circuit. In a typical stiffener design with an orthogonal cut out, the edges of the cut out are disposed at a greater distance from the corners of the integrated circuit than they are from the sides of the integrated circuit. This inhibits the prior art stiffener from providing the enhanced structural support at the corners of the integrated circuit that is provided by the stiffener of the present invention.

However, the stiffener of the present invention provides this enhanced support at the corners of the integrated circuit without having the edges of the cut out encroaching closer to the sides of the integrated circuit, which would tend to interfere with the under fill of the integrated circuit. In a prior art stiffener design, the edges of the cut out would have to encroach on the sides of the integrated circuit in order to get closer to the corners of the integrated circuit. Thus, the packaged integrated circuit according to the present invention has benefits over the prior art.

In various preferred embodiments, a heat spreader is thermally connected to the integrated circuit. Preferably, the edges of the cut out are disposed at a lesser distance from the corners of the integrated circuit than they are from the sides of the integrated circuit. In one embodiment, the stiffener extends to a peripheral edge of the package substrate and the heat spreader is mounted within a recessed portion at a peripheral edge of the stiffener. In an alternate embodiment the stiffener does not extend to the peripheral edge of the package substrate and the heat spreader is mounted within a recessed portion at the peripheral edge of the package substrate.

In yet another embodiment, the stiffener does not extend to the peripheral edge of the package substrate and the heat spreader is mounted at the peripheral edge of the package substrate. In a further embodiment, the stiffener does not extend to the peripheral edge of the package substrate and the heat spreader is mounted at the peripheral edge of the package substrate and is electrically connected to a ground contact of the package substrate.

Alternately, the stiffener extends to a peripheral edge of the package substrate and is electrically connected to a ground contact of the package substrate, and the heat spreader is mounted within a recessed portion at a peripheral edge of the stiffener and is electrically connected to the stiffener and is thus in electrical contact with the ground contact of the package substrate. Preferably, the stiffener and the heat spreader are formed of copper. In one embodiment the cut out of the stiffener is formed in a circular shape, and in another embodiment the cut out of the stiffener is formed in an octagonal shape. Most preferably, the edges of the stiffener are disposed at a lesser distance from the corners of the integrated circuit than they are from the edges of the integrated circuit.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
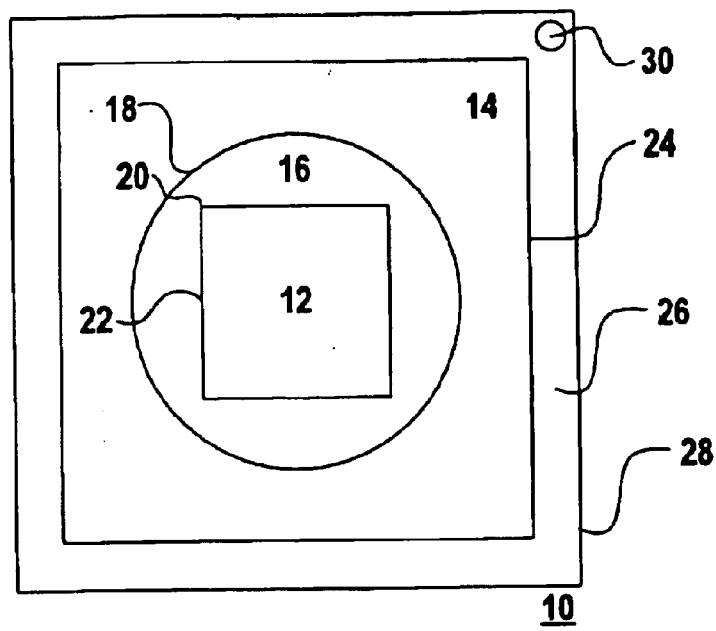
FIG. 1 is a top plan view of a packaged integrated circuit with a circular cut out in the stiffener.

With reference now to FIG. 1, there is depicted a top plan view of a packaged integrated circuit 10 with a circular cut out 16 in the stiffener 14. As can be clearly seen in FIG. 1, the circular cut out 16 in the stiffener 14 allows the edges 18 of the cut out 16 to be no further away from the corners 20 of the integrated circuit 12 than they are from the sides 22 of the integrated circuit 12. Indeed, preferably the edges 18 of the cut out 16 are closer to the corners 20 of the integrated circuit 12 than they are to the sides 22 of the integrated circuit 12. However, with this configuration for the cut out 16 of the stiffener 14, the edge 18 does not need to be significantly closer to the sides 22 of the integrated circuit 12 in order to accomplish this, as would be required by prior art stiffeners with orthogonal cut outs, such as squares or rectangles.

The stiffener 14 is preferably formed of a layer of material that has relatively good structural properties, such as a metal, and most preferably copper. The material for the stiffener 14 may also be selected with other criteria in mind, such as the ability to distribute thermal energy, and the ability to provide electrical shielding, metals tend to provide all of the properties as described, but other materials that are compatible with the structures, functions, and processes as described and implied herein are also suitable for this use.

Also depicted in FIG. 1 is the edge 24 of the stiffener 14, which does not extend in this embodiment to the peripheral edge of the underlying package substrate 28. There is included in this embodiment a recess 26 in the top surface of the package substrate 28, which is formed by either building up additional layers on the interior portions of the substrate 28, or removing layers on the peripheral portions of the substrate 28, whichever is more easily accomplished, depending at least in part upon other design criteria for the substrate 28. Also depicted in FIG. 1 is an electrical contact 30 in the substrate 28, which is most preferably a ground contact. The significance of the recess 26 and the ground contact 30 are described in more detail hereafter.

Figure 2:
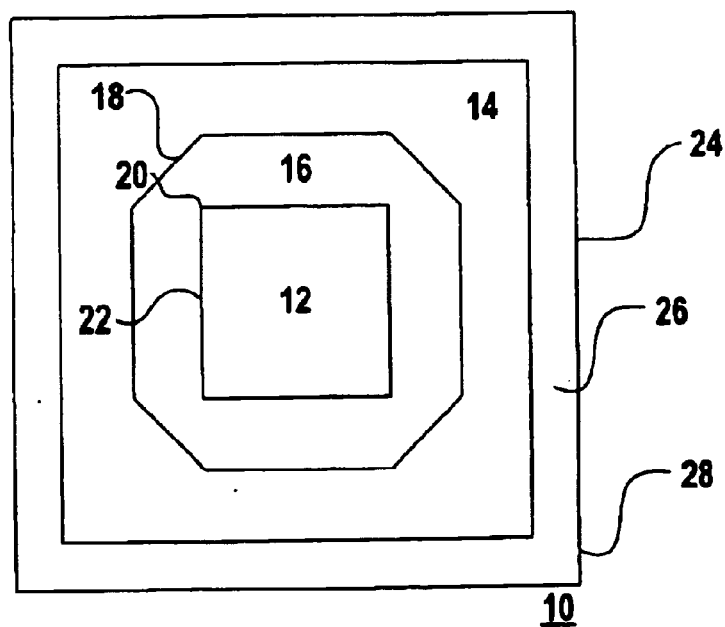
FIG. 2 is a top plan view of a packaged integrated circuit with an octagonal cut out in the stiffener.

With reference now to FIG. 2 there is depicted a top plan view of a packaged integrated circuit 10 with an octagonal cut out 16 in the stiffener 14. As mentioned in reference to the circular cut out 16 of FIG. 1, the octagonal cut out 16 in the stiffener 14 allows the edges 18 of the cut out 16 to be no further away from the corners 20 of the integrated circuit 12 than they are from the sides 22 of the integrated circuit 12. However, with this configuration for the cut out 16 of the stiffener 14, the edge 18 does not need to be significantly closer to the sides 22 of the integrated circuit 12 in order to accomplish this, as would be required by prior art stiffeners with orthogonal cut outs, such as squares or rectangles.

As mentioned above in regard to FIG. 1, the octagonal cut out 16 preferably allows the edge 18 of the cut out 16 to be closer to the corners 20 of the integrated circuit 12 than it is to the sides 22 of the integrated circuit 12. It is appreciated that although the two specific shapes of an octagonal and a circular cut out 16 are depicted, other configurations for the cut out 16 are also available, which are not orthogonal, or in other words, which do not have all right angle edges. However, in a most preferred embodiment, the cut out 16 has at least eight sides, which number of sides may be increased as desired to the infinite limit, which is a circular cut out 16.

Also depicted in FIG. 2 is the edge 24 of the stiffener 14, which in this embodiment extends to the peripheral edge of the underlying package substrate 28. In this embodiment the recess 26 is in the top surface of the stiffener 14. In one embodiment there is an electrically contact 30 in the substrate 28, again most preferably a ground contact, which makes electrical connection with the stiffener 14, which is most preferably electrically conductive.

Figure 3:
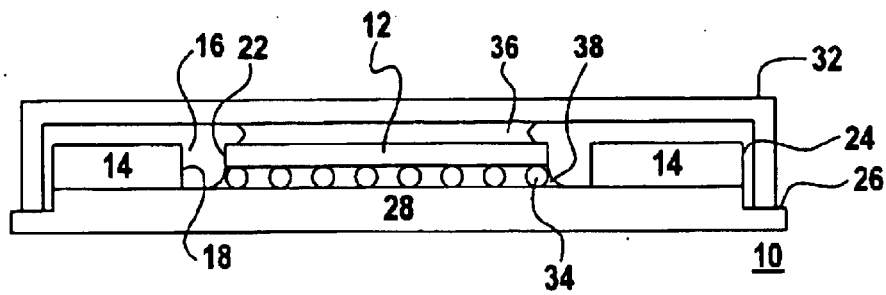
FIG. 3 is a cross sectional view of a packaged integrated circuit where the heat spreader is mounted to a recessed portion of the package substrate.

With reference now to FIG. 3, there is depicted a cross sectional view of a packaged integrated circuit 10 where a heat spreader 32 is mounted to the recessed portion 26 of the package substrate 28, such as described in regard to FIG. 1. In this embodiment the stiffener 14 resides within the interior cavity formed by the heat spreader 32, which also preferably acts a lid to the packaged integrated circuit 10. The heat spreader 32 is in thermal communication with the integrated circuit 12, such as through a heat conductive epoxy or grease 36. The heat spreader 32 also preferably makes an electrical connection with the electrical contact 30 in the package substrate 28. In this manner, the heat spreader 32 is grounded, and provides additional electrical shielding for the integrated circuit 12.

As depicted in FIG. 3, the non orthogonal recess 16 in the stiffener 14 ensures that the edge 18 of the stiffener 14 is close enough to, but not too close to the edges 22 and corners 20 of the integrated circuit 12, so that adequate structural support is provided, but the under fill material 38 is not interfered with. The integrated circuit 12 preferably makes electrical connections with the packages substrate 28 such as by solder bumps 34.

Figure 4:
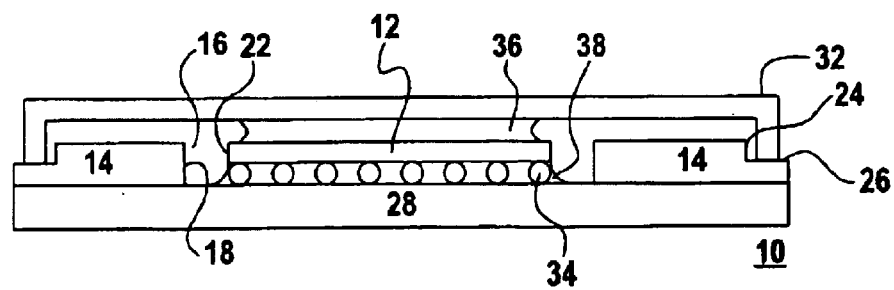
FIG. 4 is a cross sectional view of a packaged integrated circuit where the heat spreader is mounted to a non recessed portion of the package substrate.

FIG. 4 is a cross sectional depiction of an alternate embodiment of the packaged integrated circuit 10, where the recess 26 is in a peripheral portion of the stiffener 14, rather than in the top surface of the package substrate 28. In this embodiment, the stiffener 14 is preferably electrically connected to the electrical contact 30 in the package substrate 28, and the heat spreader 32 is preferably electrically connected to the electrically conductive stiffener 14. In this manner, both the stiffener 14 and the heat spreader 32 provide additional electrical shielding to the integrated circuit 12.

Figure 5:
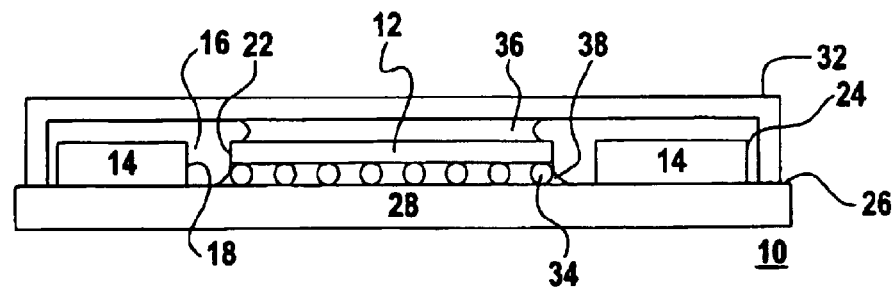
FIG. 5 is a cross sectional view of a packaged integrated circuit where the heat spreader is mounted to an effectual recessed portion between the stiffener and the package substrate.

FIG. 5 depicts yet another embodiment, where there is no recess per se formed in either the package substrate 28 or the stiffener 14, but an effectual recess 26 is formed between the peripheral edge of the package substrate 28 and the peripheral edge of the stiffener 14. In this embodiment, the heat spreader 32 is preferably electrically connected to the electrical contact 30 in the package substrate, and thereby provides additional electrical shielding to the integrated circuit 12.

The recesses 26 provide a valuable function in the packaged integrated circuit 10, by providing for the careful alignment of the heat spreader 32 to the package substrate 28. It is easy with prior art designs to misalign the heat spreader 32 to the package substrate 28, which causes reliability problems later on. However, the recess 26 provides for a more sure alignment between the package substrate 28 and the heat spreader 32.

In the figures, the thickness of the heat spreader 32 where it fits into the recess 26 is much thinner than the width of the recess 26. However, it is appreciated that this is for simplicity and clarity in the figures. In actual implementation, the thickness of the heat spreader 32 would be much closer to the width of the recess 26, so that there could be far less variation in the fit of the heat spreader 32 to the recess 26. This tighter fit could be accomplished in a variety of ways, such as either making the thickness of the heat spreader 32 more nearly the same as the width of the recess 26, or making the diameter of the heat spreader 32 such that it just barely fits within the recess 26. In either way, the heat spreader 32 fits more snugly, and cannot be misaligned to the point where it presents a reliability problem.

Because the stiffener 14 is preferably mounted to an upper surface of the package substrate 28, the stiffener 14 and the package substrate 28 preferably do not share any portion of a common horizontal plane. However, because the stiffener 14 and the integrated circuit 12 are preferably both mounted to the upper surface of the package substrate 28, the stiffener 14 and the integrated circuit 12 are thereby preferably disposed at least in part within a common horizontal plane, as depicted in FIGS. 3–5. Most preferably, the non-orthogonal cut out 16 of the stiffener 14 has substantially vertical sidewalls.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A packaged integrated circuit, comprising:
   a package substrate having electrical contacts for receiving an integrated circuit, the integrated circuit electrically connected to the electrical contacts of the package substrate, the integrated circuit having corners and sides,
   a stiffener mounted to the package substrate, the stiffener and the integrated circuit thereby disposed at least in part within a common horizontal plane, where the stiffener and the package substrate do not share any portion of a common horizontal plane, the stiffener having a non-orthogonal cut out with substantially vertical sidewalls in which the integrated circuit is disposed, and
   a heat spreader thermally connected to the integrated circuit.

2. A packaged integrated circuit, comprising:
   a package substrate having electrical contacts for receiving an integrated circuit,
   the integrated circuit electrically connected to the electrical contacts of the package substrate, the integrated circuit having corners and sides,
   a stiffener mounted to the package substrate, the stiffener having a non-orthogonal cut out in which the integrated circuit is disposed, and
   a heat spreader thermally connected to the integrated circuit,
   wherein the stiffener does not extend to a peripheral edge of the package substrate and the heat spreader is mounted within a recessed portion at the peripheral edge of the package substrate.

3. The packaged integrated circuit of claim 1, wherein the stiffener does not extend to a peripheral edge of the package substrate and the heat spreader is mounted at the peripheral edge of the package substrate and is electrically connected to a ground contact of the package substrate.

4. The packaged integrated circuit of claim 1, wherein the stiffener is formed of copper.

5. The packaged integrated circuit of claim 1, wherein the heat spreader is formed of copper.

6. The packaged integrated circuit of claim 1, wherein the cut out of the stiffener is formed in a circular shape.

7. A packaged integrated circuit, comprising:
   a package substrate having electrical contacts for receiving an integrated circuit,
   the integrated circuit electrically connected to the electrical contacts of the package substrate, the integrated circuit having corners and sides,
   a stiffener mounted to the package substrate, the stiffener and the integrated circuit thereby disposed at least in part within a common horizontal plane, where the stiffener and the package substrate do not share any portion of a common horizontal plane, the stiffener having a non-orthogonal cut out with substantially vertical sidewalls in which the integrated circuit is disposed, wherein the cut out of the stiffener is formed in an octagonal shape, and
   a heat spreader thermally connected to the integrated circuit.

* * * * *